(12) United States Patent
Lopatin et al.

(10) Patent No.: US 6,811,671 B1
(45) Date of Patent: Nov. 2, 2004

(54) METHOD OF CONTROLLING ZINC-DOPING IN A COPPER-ZINC ALLOY THIN FILM ELECTROPLATED ON A COPPER SURFACE AND A SEMICONDUCTOR DEVICE THEREBY FORMED

(75) Inventors: Sergey Lopatin, Santa Clara, CA (US); Alexander H. Nickel, Mountain View, CA (US); Joffre F. Bernard, Santa Clara, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 350 days.

(21) Appl. No.: 10/082,433

(22) Filed: Feb. 22, 2002

(51) Int. Cl.[7] .............................. C25D 7/12; H01L 29/12
(52) U.S. Cl. ........................ 205/157; 205/123; 205/148; 205/224; 205/227; 205/228; 205/240; 205/316; 428/620; 428/674; 428/675; 428/469; 428/935; 438/687; 438/758
(58) Field of Search .............................. 205/157, 123, 205/148, 224, 227, 228, 240, 316; 428/620, 674, 675, 469, 935; 438/687, 758

(56) References Cited

U.S. PATENT DOCUMENTS

| 6,022,808 A | 2/2000 | Nogami et al. | |
|---|---|---|---|
| 6,197,181 B1 | 3/2001 | Chen | |
| 6,515,368 B1 * | 2/2003 | Lopatin et al. | ............. 257/762 |

OTHER PUBLICATIONS

Peter Van Zant, "Microchip Fabrication: A Practical Guide to Semiconductor Processing", 3rd Ed., p. 392 and 397 (1997), (no month given).

A. Krishnamoorthy, D. Duquette and S. Murarka, "Electrochemical Codeposition and Electrical Characterization of a Copper–Zinc Alloy Metallization", in edited by Adricacos, et al., Electrochem Society Symposium Proceedings, vol. 99–9, May 3–6, Seattle, p. 212, (no year given).

J. Cunningham, "Using Electrochemistry to Improve Copper Interconnect", in Semiconductor International, Spring (May) 2000, (no page numbers).

L. Chen and T. Ritzdorf, "ECD Seed Layer for Inlaid Copper Metallization" in edited by Andricacos, et al., Electrochem Society Proceedings, vol. 99–9, May 3–6, Seattle, p. 122, (no year given).

* cited by examiner

Primary Examiner—Robert R. Koehler
(74) Attorney, Agent, or Firm—Farjami & Farjami LLP

(57) ABSTRACT

A method of fabricating a semiconductor device, having a reduced-oxygen Cu—Zn alloy thin film (30) electroplated on a Cu surface (20) by electroplating, using an electroplating apparatus, the Cu surface (20) in a unique chemical solution containing salts of zinc (Zn) and copper (Cu), their complexing agents, a pH adjuster, and surfactants; and annealing the electroplated Cu—Zn alloy thin film (30); and a semiconductor device thereby formed. The method controls the parameters of pH, temperature, and time in order to form a uniform reduced-oxygen Cu—Zn alloy thin film (30), having a controlled Zn content, for reducing electromigration on the Cu—Zn/Cu structure by decreasing the drift velocity therein which decreases the Cu migration rate in addition to decreasing the void formation rate, for improving device reliability, and for increasing corrosion resistance.

18 Claims, 4 Drawing Sheets

Figure 1:
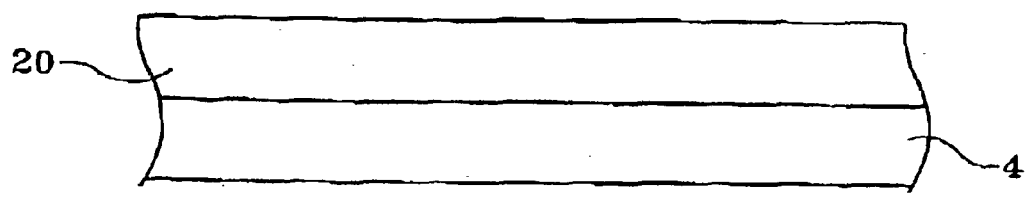

METHOD OF CONTROLLING ZINC-DOPING IN A COPPER-ZINC ALLOY THIN FILM ELECTROPLATED ON A COPPER SURFACE AND A SEMICONDUCTOR DEVICE THEREBY FORMED

CROSS-REFERENCE TO RELATED APPLICATION(S)

This application is also related to the following commonly assigned applications, entitled:

(1) "Chemical Solution for Electroplating a Copper-Zinc Alloy Thin Film," concurrently filed (Ser. No. 10/081,074);
(2) "Method of Electroplating a Copper-Zinc Alloy Thin Film on a Copper Surface Using a Chemical Solution and a Semiconductor Device thereby Formed," concurrently filed (Ser. No. 10/082,432: U.S. Pat. No. 6,528,424);
(3) "Method of Reducing Electromigration in a Copper Line by Electroplating an Interim Copper-Zinc Alloy Thin Film on a Copper Surface and a Semiconductor Device thereby Formed," concurrently filed (Ser. No. 10/083,809; U.S. Pat. No. 6,660,633);
(4) "Method of Reducing Electromigration in a Copper Line by Zinc-Doping of a Copper Surface from an Electroplated Copper-Zinc Alloy Thin Film and a Semiconductor Device thereby Formed," filed on Dec. 7, 2001, U.S. patent application Ser. No. 10/016,410 U.S. Pat No. 6,515,368.;
(5) "Method of Reducing Electromigration by Forming an Electroplated Copper-Zinc Interconnect and a Semiconductor Device thereby Formed," concurrently filed (Ser. No. 10/084,563; U.S. Pat. No. 6,,717,236);
(6) "Method of Reducing Electromigration by Ordering Zinc-Doping in an Electroplated Copper-Zinc Interconnect and a Semiconductor Device thereby Formed," filed on Dec. 7, 2001, U.S. patent application Ser. No. 10/016,645 (U.S. Pat No. 6,630,741).

TECHNICAL FIELD

The present invention relates to semiconductor devices and their methods of fabrication. More particularly, the present invention relates to the processing of copper interconnect material and the resultant device utilizing the same. Even more particularly, the present invention relates to reducing electromigration in copper interconnect lines by doping their surfaces with a barrier material using wet chemical methods.

BACKGROUND ART

Currently, the semiconductor industry is demanding faster and denser devices (e.g., 0.05-$\mu$m to 0.25-$\mu$m) which implies an ongoing need for low resistance metallization. Such need has sparked research into resistance reduction through the use of barrier metals, stacks, and refractory metals. Despite aluminum's (Al) adequate resistance, other Al properties render it less desirable as a candidate for these higher density devices, especially with respect to its deposition into plug regions having a high aspect ratio cross-sectional area. Thus, research into the use of copper as an interconnect material has been revisited, copper being advantageous as a superior electrical conductor, providing better wettability, providing adequate electromigration resistance, and permitting lower depositional temperatures. The copper (Cu) interconnect material may be deposited by chemical vapor deposition (CVD), plasma-enhanced chemical vapor deposition (PECVD), sputtering, electroless plating, and electrolytic plating.

However, some disadvantages of using Cu as an interconnect material include etching problems, corrosion, and diffusion into silicon.[1] These problems have instigated further research into the formulation of barrier materials for preventing electromigration in both Al and Cu interconnect lines. In response to electromigration concerns relating to the fabrication of semiconductor devices particularly having aluminum-copper alloy interconnect lines, the industry has been investigating the use of various barrier materials such as titanium-tungsten (TiW) and titanium nitride (TiN) layers as well as refractory metals such as titanium (Ti), tungsten (W), tantalum (Ta), molybdenum (Mo), and their suicides.[2] Although the foregoing materials are adequate for Al interconnects and Al—Cu alloy interconnects, they have not been entirely effective with respect to all-Cu interconnects. Further, though CVD and PECVD have been conventionally used for depositing secondary metal(s) on a primary metal interconnect surface, neither technique provides a cost-effective method of forming a copper-zinc alloy on a Cu interconnect surface. Therefore, a need exists for a low cost and high throughput method of forming by electroplating a uniform Cu-rich copper-zinc alloy (Cu—Zn) thin film on a cathode-wafer surface, such as a copper (Cu) surface, in a stable chemical solution, and controlling the Zn-doping thereof, which improves interconnect reliability, enhances electromigration resistance, and improves corrosion resistance.

[1]Peter Van Zant, Microchip Fabrication: A Practical Guide to Semiconductor Processing, 3$^{rd}$ Ed., p. 397 (1997).
[2]Id., at 392.

DISCLOSURE OF INVENTION

Accordingly, the present invention provides a method of controlling the Zn-doping of a Cu—Zn alloy thin film formed by electroplating a Cu surface and a semiconductor device thereby formed. The present method involves electroplating the Cu surface in a unique nontoxic aqueous chemical electroplating solution containing salts of zinc (Zn) and copper (Cu), their complexing agents, a pH adjuster, and surfactants; and annealing the Cu—Zn alloy thin film formed on the Cu surface in an environment such as vacuum, nitrogen ($N_2$), hydrogen ($H_2$), formine ($N_2H_2$), or mixtures thereof for reducing the oxygen (O) concentration in the alloy thin film, for modifying the grain structure of the Cu—Zn alloy thin film as well as of the underlying Cu surface, and for forming a mixed Cu—Zn/Cu interface. The present invention further provides a particular electroplating method which controls the parameters of Zn concentration, pH, temperature, and time in order to form a uniform reduced-oxygen copper-zinc alloy (Cu—Zn) thin film on a cathode-wafer surface such as a copper (Cu) surface for reducing electromigration in the device by decreasing the drift velocity therein which decreases the Cu migration rate in addition to decreasing the void formation rate.

More specifically, the present invention provides a method for fabricating a semiconductor device having a Cu—Zn alloy thin film formed on a Cu surface by electroplating the Cu surface in the present chemical solution. The method generally comprises the steps of: (1) providing a semiconductor substrate having a Cu surface; (2) providing a chemical solution; (3) electroplating the Cu surface in the chemical solution, thereby forming the Cu—Zn alloy thin film on the Cu surface; (4) rinsing the Cu—Zn alloy thin film; (5) drying the Cu—Zn alloy thin film; (6) annealing the Cu—Zn alloy thin film; and (7) completing fabrication of the semiconductor device.

By electroplating this Cu—Zn alloy thin film on the cathode-wafer surface such as a Cu surface using a stable chemical solution in the prescribed concentration ranges and by subsequently annealing the Cu—Zn alloy thin film electroplated on the Cu surface, the present invention improves Cu interconnect reliability, enhances electromigration resistance, improves corrosion resistance, and reduces manufacturing costs. In particular, the present invention chemical solution is advantageous in that it facilitates formation of an acceptable Cu—Zn alloy thin film over a wide range of bath compositions while the subsequent annealing step removes undesirable oxygen impurities from the formed alloy thin film. The desirable Zn concentration in the Cu—Zn alloy thin film, preferably in a range of approximately 0.2 at. % to approximately 9.0 at. % determined by X-Ray Photoelectron Spectroscopy (XPS) or Auger Electron Spectroscopy (AES), is controllable by varying the electroplating conditions and/or the bath composition.

These advantages arise from the present invention's superior fill-characteristics. The present Cu—Zn electroplating solution facilitates better filling of a Cu—Zn alloy thin film on an interconnect, especially for feature sizes in a dimensional range of approximately 0.2 $\mu$m to approximately 0.05 $\mu$m, thereby lowering the resistance of the formed Cu—Zn alloy thin film (e.g., in a resistance range of approximately 2.2 $\mu\Omega$.cm to approximately 2.5 $\mu\Omega$.cm for approximately 1 at. % Zn content in a Cu—Zn alloy thin film, as deposited). Further, the filling capability is enhanced by three beneficial characteristics of the present invention: (1) the instant chemical solution does not etch copper or a copper alloy seed layer; (2) the introduction of Zn into the alloy thin film as well as onto the Cu interconnect improves both step coverage and nucleation; and (3) a variety of organic additives, such as polyethylene glycol (PEG), organo-disulfides, and organo-chlorides, are compatible and may be included in the instant chemical solution for further enhancing the fill profile and grain structure. The present Cu—Zn electroplating solution provides a desirably low Zn content in a Cu alloy interconnect (e.g., in a concentration range of approximately 0.2 at. % to approximately 1.0 at. %) which also imparts (1) a de minimis increase in resistance as well as (2) a maximum improvement in electrozigration resistance. The present chemical solution can also provide a desirably low Zn content (e.g., in a range of <<approximately 0.1 at. % or <<approximately 0.2 at. %, virtually undetectable by AES) in a Cu film, wherein the Zn content may be engineered by varying the deposition parameters as well as by modifying the bath composition.

BRIEF DESCRIPTION OF THE DRAWING(S)

For a better understanding of the present invention, reference is made to the below-referenced accompanying drawings. Reference numbers refer to the same or equivalent parts of the present invention throughout the several figures of the drawings.

(1) FIG. 1 is a cross-sectional view of a Cu surface formed and disposed on a semiconductor substrate, in accordance with the present invention.

Figure 2:
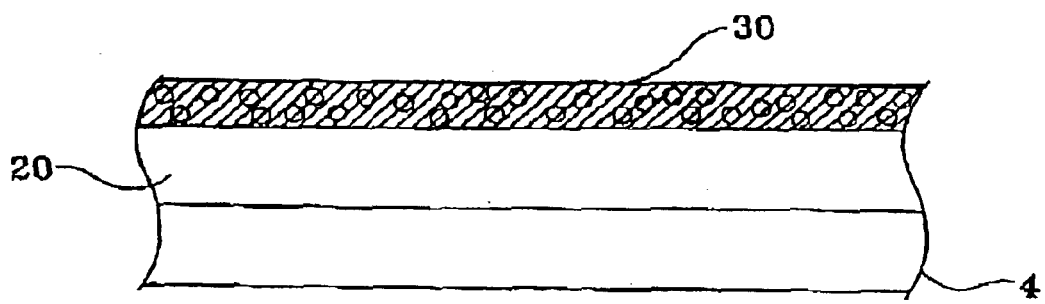

(2) FIG. 2 is a cross-sectional view of the Cu surface formed on the substrate, as shown in FIG. 1, further having a Cu—Zn alloy thin film electroplated and disposed on the Cu surface, before annealing which still has undesirable oxygen impurities, in accordance with the present invention.

Figure 3:
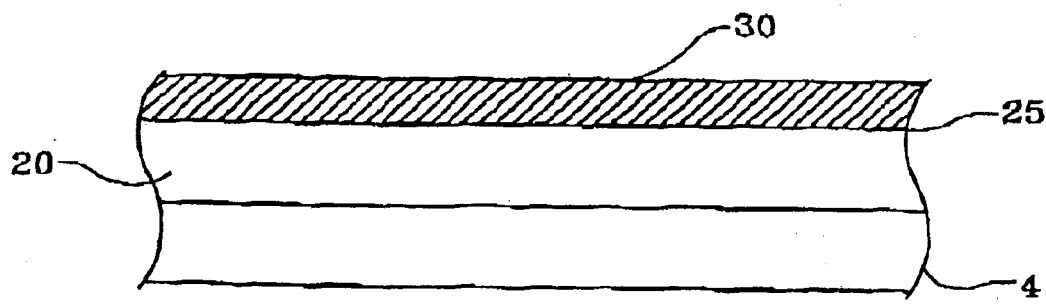

(3) FIG. 3 is a cross-sectional view of the Cu—Zn alloy thin film electroplated and disposed on the Cu surface, as shown in FIG. 2, after annealing which results in removal of the undesirable oxygen impurities, modification of grain structure, and formation of a mixed Cu—Zn/Cu interface, in accordance with the present invention.

Figure 4:
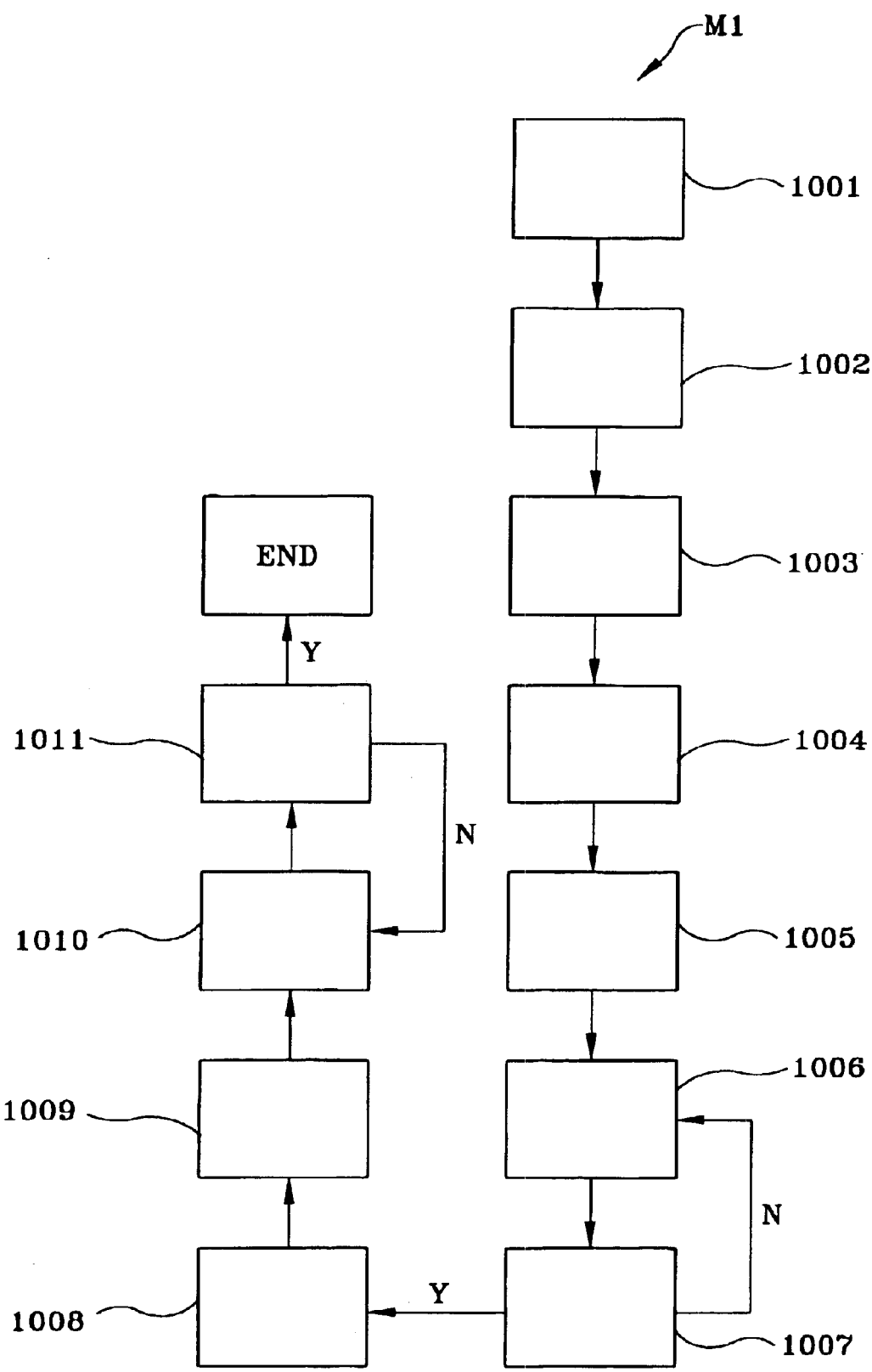

(4) FIG. 4 is a flowchart of a method for synthesizing a unique nontoxic aqueous Cu—Zn electroplating (chemical) solution, in accordance with the present invention.

Figure 5:
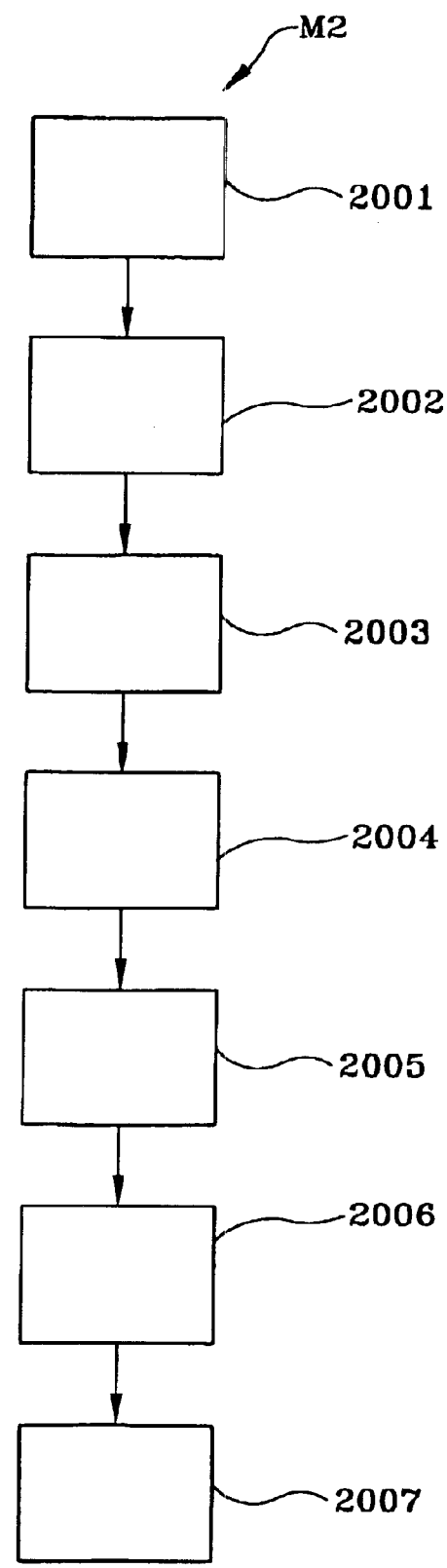

(5) FIG. 5 is a flowchart of a method for forming an annealed Cu—Zn alloy thin film on a Cu surface, in accordance with the present invention.

Figure 6:
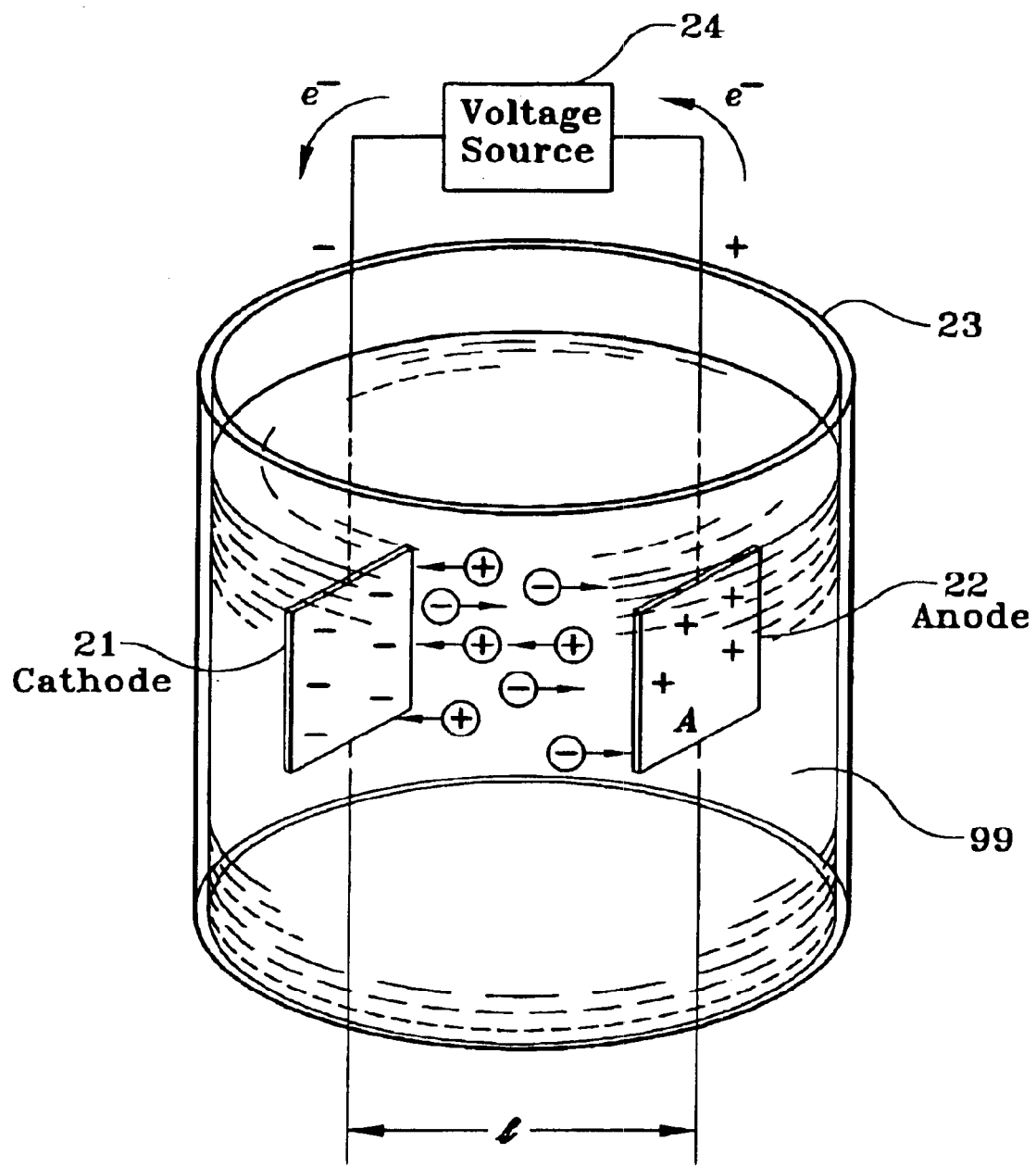

(6) FIG. 6 is a perspective view of an electroplating apparatus using the unique nontoxic aqueous Cu—Zn chemical solution, in accordance with the present invention.

MODES FOR CARRYING OUT THE INVENTION

FIG. 1 illustrates, by example only, and in cross-section, a Cu surface 20 formed and disposed on a semiconductor substrate 4, in accordance with the present invention.

FIG. 2 is a cross-sectional view of the Cu surface 20 formed on the substrate 4, as shown in FIG. 1, further having a Cu—Zn alloy thin film 30 electroplated and disposed on the Cu surface 20, before annealing which still has undesirable oxygen impurities, in accordance with the present invention.

FIG. 3 is a cross-sectional view of the Cu—Zn alloy thin film 30 electroplated and disposed on the Cu surface 20, as shown in FIG. 2, after annealing which results in removal of the undesirable oxygen impurities, modification of grain structure, and formation of a mixed Cu—Zn/Cu interface 25, in accordance with the present invention.

FIG. 4 flowcharts, by example only, a method M1 for synthesizing a liter of a unique nontoxic aqueous Cu—Zn electroplating (chemical) solution, in accordance with the present invention:

(1) cleaning a mixing vessel (e.g., a beaker) with dilute nitric acid ($HNO_3$) for approximately 5 minutes, as indicated by block 1001;

(2) rinsing the mixing vessel in deionized (DI) water for approximately 5 minutes to approximately 10 minutes and subsequently drying the mixing vessel, for instance, under a gaseous nitrogen ($GN_2$) flow, as indicated by block 1002;

(3) adding an initial volume of DI water (e.g., approximately 400 ml) to the mixing vessel, as indicated by block 1003;

(4) adding at least one Cu ion source for providing a plurality of Cu ions and stirring the at least one Cu ion source into the DI water for a duration in a range of approximately 5 minutes to approximately 10 minutes or until complete dissolution of the at least one Cu ion source in the DI water is achieved, as indicated by block 1004;

(5) adding at least one complexing agent for complexing the plurality of Cu ions and stirring the at least one complexing agent until complete dissolution of the at least one complexing agent in the DI water is achieved, as indicated by block 1005;

(6) adding at least one pH adjuster and stirring the at least one pH adjuster into the DI water for a duration in a range of approximately 5 minutes to approximately 10 minutes or until a clean and transparent solution is achieved, as indicated by block 1006;

(7) measuring the pH of the solution, and, if the pH is within the desired range, proceeding to step (8), otherwise titrating the solution with a small volume of the at least one pH adjuster until the pH falls within the desired range, in essence, returning to step (6), as indicated by block 1007;

(8) adding at least one Zn ion source for providing a plurality of Zn ions and stirring the at least one Zn ion source into the DI water for a duration in a range of approximately 5 minutes to approximately 10 minutes or until complete dissolution of the at least one Zn ion source in the DI water is achieved, as indicated by block 1008;

(9) adding a final volume of DI water (e.g., effecting approximately 1 L in total solution volume) to the mixing vessel, as indicated by block 1009;

(10) optionally adding at least one complexing agent for complexing the plurality of Zn ions and stirring the at least one complexing agent until complete dissolution of the at least one complexing agent in the DI water is achieved, as indicated by block 1010; and

(11) measuring the pH of the solution, and, if the pH is within the desired range, terminating the synthesis, otherwise further titrating the solution with a small volume of the at least one pH adjuster until the pH falls within the desired range, in essence, returning to step (10), as indicated by block 1011.

In addition, the present invention chemical solution may be formulated as follows: wherein the at least one zinc (Zn) ion source comprises at least one zinc salt selected from a group consisting essentially of zinc acetate (($CH_3CO_2)_2Zn$), zinc bromide ($ZnBr_2$), zinc carbonate hydroxide ($ZnCO_3 \cdot 2Zn(OH)_2$), zinc dichloride ($ZnCl_2$), zinc citrate (($O_2CCH_2C(OH)(CO_2)CH_2CO_2)_2Zn_3$), zinc iodide ($ZnI_2$), zinc L-lactate (($CH_3CH(OH)CO_2)_2Zn$), zinc nitrate (Zn$(NO_3)_2$), zinc stearate ($CH_3(CH_2)_{16}CO_2)_2Zn$), zinc sulfate ($ZnSO_4$), zinc sulfide (ZnS), zinc sulfite ($ZnSO_3$), and their hydrates (preferably zinc chloride or zinc dichloride and zinc citrate), wherein the at least one complexing agent for complexing the plurality of Zn ions comprises tartaric acid ($HO_2CCH(OH)CH(OH)CO_2H$), wherein the tartaric acid prevents precipitation of the plurality of Zn ions from the chemical solution, wherein the at least one copper (Cu) ion source comprises at least one copper salt selected from a group consisting essentially of copper(I) acetate ($CH_3CO_2Cu$), copper(II) acetate (($CH_3CO_2)_2Cu$), copper(I) bromide (CuBr), copper(II) bromide ($CuBr_2$), copper(II) hydroxide ($Cu(OH)_2$), copper(II) hydroxide phosphate ($Cu_2(OH)PO_4$), copper(I) iodide (CuI), copper(II) nitrate hydrate (($CuNO_3)_2$), copper(II) sulfate ($CuSO_4$), copper(I) sulfide ($Cu_2S$), copper(II) sulfide (CuS), copper(II) tartrate ((CH(OH)CO_2)_2Cu$), and their hydrates (preferably copper sulfate), wherein the at least one complexing agent for the plurality of Cu ions comprises at least one species selected from a group consisting essentially of ethylene diamine "EDA" ($H_2NCH_2CH_2NH_2$) and ethylenediaminetetraacetic acid "EDTA" (($HO_2CCH_2)_2NCH_2CH_2N(CH_2CO_2H)_2$), wherein the at least one complexing agent for the plurality of Cu ions prevents precipitation of the plurality of Cu ions from the chemical solution, wherein the at least one pH adjuster comprises at least one pH-adjusting compound selected from a group consisting essentially of ammonium hydroxide ($NH_4OH$) and tetramethylammonium hydroxide "TMAH" (($CH_3)_4NOH$), wherein the at least one wetting agent comprises a surfactant, and wherein the surfactant comprises at least one surfactant selected from a group of surfactants consisting essentially of RE-610™ and polyethylene glycol (PEG).

In the preferred embodiment of the chemical solution, the composition of the method M1 is formulated with component concentration ranges as follows: wherein the at least one zinc (Zn) ion source is provided in a concentration range of approximately 5 g/L to approximately 10 g/L (preferably approximately 10 g/L), wherein the at least one optional complexing agent for complexing the plurality of Zn ions is provided in a concentration range of approximately 10 g/L to approximately 30 g/L (preferably approximately 20 g/L), wherein the at least one copper (Cu) ion source is provided in a concentration range of approximately 5 g/L to approximately 20 g/L (preferably approximately 10 g/L), wherein the at least one complexing agent for complexing the plurality of Cu ions is provided in a concentration range of approximately 40 g/L to approximately 100 g/L (preferably approximately 80 g/L), wherein the at least one pH adjuster is provided in a concentration range of approximately 10 g/L to approximately 20 g/L (preferably approximately 15 g/L), wherein the at least one wetting agent is provided in a concentration range of approximately 0.01 g/L to approximately 0.1 g/L (preferably approximately 0.02 g/L), wherein the volume of water is provided in a volume range of up to and including approximately 1 L, wherein the solution flow rate is in a range of approximately less than 3 L/min, wherein the solution stir rate is in a range of approximately less than 700 rpm, and wherein the wafer rotation rate is in a range of approximately less than or equal to 700 rpm.

Also, the preferred embodiment involves the following process parameters ranges: wherein the at least one pH adjuster adjusts the chemical solution to a pH range of approximately 7 to approximately 14 (preferably in a pH range of approximately 10 to approximately 12), wherein the chemical solution may be maintained in a temperature range of approximately 16° C. to approximately 35° C. (preferably at a temperature of approximately 24° C.), wherein the Cu surface 20 is immersed for a duration in a range of approximately 30 seconds to approximately 120 seconds (preferably for a duration of approximately 60 sec), wherein the Cu—Zn alloy thin film 30 is formed having a thickness in a range of approximately 10 nm to approximately 200 nm (preferably having a thickness of approximately 30 nm), and wherein the formed Cu-rich Cu—Zn alloy thin film 30 has a low Zn content of approximately 10 at. % and a high Cu content of approximately 90 at. % (preferably ~1–2 at. % Zn: ~98–99 at. % Cu).

FIG. 5 flowcharts, by example only, a method M2 for forming an annealed copper-zinc alloy (Cu—Zn) thin film 30 on a copper (Cu) surface 20, having been formed by CVD, PVD, PECVD or electroplating, by electroplating the Cu surface 20 in a chemical solution, comprising the steps of: (1) providing a semiconductor substrate having a Cu surface 20 which may be formed a technique such as chemical vapor deposition (CVD), plasma vapor deposition (PVD), plasma-enhanced chemical vapor deposition (PECVD), or atomic layer deposition (ALD), as indicated by block 2001; (2) providing a chemical solution, the chemical solution comprising: at least one zinc (Zn) ion source for providing a plurality of Zn ions; at least one copper (Cu) ion source for providing a plurality of Cu ions; at least one complexing agent for complexing the plurality of Cu ions; at least one pH adjuster; at least one wetting agent for stabilizing the chemical solution, all being dissolved in a volume of deionized (DI) water, as shown by block 2002; (3) electroplating the cathode-wafer surface 20, such as a Cu surface, in the chemical solution, thereby forming the Cu—Zn alloy thin film 30 on the Cu surface 20, as shown by block 2003; (4) rinsing the Cu—Zn alloy thin film 30 formed on the Cu surface 20 in water, as shown by block 2004; (5) drying the Cu—Zn alloy thin film 30 formed on the Cu surface 20, for instance, under a gaseous nitrogen flow ($GN_2$), as shown by block 2005; (6) annealing the Cu—Zn alloy thin film 30 electroplated on the Cu surface 20 in a temperature range such as 150° C. to 450° C. (preferably in a temperature of approximately 150° C. to approximately 250° C.), wherein the annealing step is performed for a duration range of approximately 0.5 minutes to approximately 60 minutes, thereby reducing the oxygen impurity concentration to a level less than that which is detectable (i.e., ~0.1 at. %) in the alloy thin film 30, thereby modifying the grain structure by increasing the grain size of both the alloy thin film 30 as well as the Cu surface 20, and thereby forming a mixed Cu—Zn interface 25 having a uniform zinc distribution, as indicated by block 2006; and (7) completing fabrication of the semiconductor device, as indicated by block 2007. The chemical solution may further comprise at least one complexing agent for complexing the plurality of Zn ions also being dissolved in the volume of DI water.

FIG. 6 illustrates, in perspective view, an electroplating apparatus using the unique nontoxic aqueous Cu—Zn chemical solution, in accordance with the present invention. In particular, the electroplating step (3) of FIG. 3 may be performed in this electroplating apparatus comprising: (a) a cathode-wafer 21; (b) an anode 22; (c) an electroplating vessel 23 such as a beaker; and (d) a voltage source 24. The cathode-wafer 21 may comprise a Cu surface 20. The anode 22 may comprise at least one material selected from a group consisting essentially of copper (Cu), a copper-platinum alloy (Cu—Pt), titanium (Ti), platinum (Pt), a titanium-platinum alloy (Ti—Pt), anodized copper-zinc alloy (Cu—Zn, i.e., brass), and platinized titanium (Pt/Ti), and platinized copper-zinc (Pt/Cu—Zn, i.e., platinized brass). The brass alloy may be anodized to form a thin oxide film in situ using the chemical solution 99 prior to electroplating the cathode-wafer 21. The anodized brass anode also provides the following benefits: (1) a uniform current density distribution on the cathode-wafer; (2) a uniform Cu—Zn alloy thin film formation, (3) a uniform Zn distribution across the Cu—Zn alloy thin film surface, and (4) a uniform Zn distribution across the Cu—Zn alloy thin film thickness. The present invention electroplating method also comprises direct voltage in the range of approximately 1 V to approximately 4 V (preferably in a voltage range of approximately 1 V to approximately 2 V); and a direct current in the range of approximately 0.01 A to approximately 0.2 A (preferably in a current range of approximately 0.1 A to approximately 0.15 A). Differential pulse conditions selected from a group consisting essentially of forward pulses, reverse pulses, combinations of forward and reverse pulses, combinations of direct current, and combinations of direct voltage may also be applied.

Further, the Zn-doping in the resultant Cu—Zn alloy thin film 30 may be controlled in the present invention by varying electroplating conditions. For example, increasing the at least one zinc (Zn) ion source concentration slowly increases Zn-doping, increasing the at least one copper (Cu) ion source concentration slowly decreases Zn-doping, increasing the solution flow rate increases Zn-doping, increasing the pH decreases cathodic efficiency with respect to Zn and thereby decreases Zn-doping, increasing the electroplating duration slowly decreases Zn-doping, using a Cu anode decreases Zn-doping, using a brass anode increases Zn-doping, increasing the voltage increases the Zn-doping, and increasing the current increases the Zn-doping.

Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. §112, sixth paragraph, unless the element is expressly recited using the phrase "means for."

INDUSTRIAL APPLICABILITY

The present invention relates to semiconductor device fabrication industry. More particularly, the present invention relates to reducing electromigration in copper interconnect lines by doping their surfaces with a barrier material using wet chemical methods. Specifically, the present invention provides a method for fabricating a semiconductor device having a Cu—Zn alloy thin film formed on a Cu surface by electroplating the Cu surface in the present chemical solution. The method generally comprises the steps of: (1) providing a semiconductor substrate having a Cu surface; (2) providing a chemical solution; (3) electroplating the Cu surface in the chemical solution, thereby forming the Cu—Zn alloy thin film on the Cu surface; (4) rinsing the Cu—Zn alloy thin film; (5) drying the Cu—Zn alloy thin film; (6) annealing the Cu—Zn alloy thin film; and (7) completing fabrication of the semiconductor device.

What is claimed is:

1. A method of fabricating a semiconductor device, having a reduced-oxygen copper-zinc alloy (Cu—Zn) thin film formed on a copper (Cu) surface by electroplating the Cu surface in a chemical solution, comprising the steps of:

forming a Cu surface on a semiconductor substrate;

providing a chemical solution;

electroplating the Cu surface in the chemical solution, thereby forming a Cu—Zn alloy thin film on the Cu surface, wherein the Cu—Zn alloy thin film completely covers the Cu surface;

rinsing the Cu—Zn alloy thin film in a solvent;

drying the Cu—Zn alloy thin film under a gaseous flow;

annealing the Cu—Zn alloy thin film formed on the Cu surface, thereby forming a reduced-oxygen Cu—Zn alloy thin film; and completing formation of the semiconductor device.

2. A method, as recited in claim 1, wherein the chemical solution is nontoxic and aqueous, and wherein the chemical solution comprises:

at least one zinc (Zn) ion source for providing a plurality of Zn ions;

at least one copper (Cu) ion source for providing a plurality of Cu ions;

at least one complexing agent for complexing the plurality of Cu ions;

at least one pH adjuster;

at least one wetting agent for stabilizing the chemical solution, all being dissolved in a volume of deionized (DI) water.

3. A method, as recited in claim 2, wherein the at least one zinc (Zn) ion source comprises at least one zinc salt selected from a group consisting of zinc acetate $((CH_3CO_2)_2Zn)$, zinc bromide $(ZnBr_2)$, zinc carbonate hydroxide $(ZnCO_3.2Zn(OH)_2)$, zinc dichloride $(ZnCl_2)$, zinc citrate $((O_2CCH_2C(OH)(CO_2)CH_2CO_2)_2Zn_3)$, zinc iodide $(ZnI_2)$ zinc L-lactate $((CH_3CH(OH)CO_2)_2Zn)$, zinc nitrate $(Zn(NO_3)_2)$, zinc stearate $((CH_3(CH_2)_{16}CO_2)_2Zn)$, zinc sulfate $(ZnSO_4)$, zinc sulfide $(ZnS)$, zinc sulfite $(ZnSO_3)$, and their hydrates.

4. A method, as recited in claim 2, wherein the at least one copper (Cu) ion source comprises at least one copper salt selected from a group consisting of copper(I) acetate $(CH_3CO_2Cu)$, copper(II) acetate $((CH_3CO_2)_2Cu)$, copper(I) bromide (CuBr), copper (II) bromide $(CuBr_2)$, copper (II) hydroxide $(Cu(OH)_2)$, copper (II) hydroxide phosphate $(Cu_2(OH)PO_4)$, copper(I) iodide (CuI), copper (II) nitrate $((CuNO_3)_2)$, copper(II) sulfate $(CuSO_4)$, copper(I) sulfide $(Cu_2S)$, copper(II) sulfide (CuS), copper (II) tartrate $((CH(OH)CO_2)_2Cu)$, and their hydrates.

5. A method, as recited in claim 1, wherein said electroplating step comprises using an electroplating apparatus, and wherein said electroplating apparatus comprises:

(a) a cathode-wafer;

(b) an anode;

(c) an electroplating vessel; and (d) a voltage source.

6. A method, as recited in claim 5, wherein the cathode-wafer comprises the Cu surface, and wherein the anode comprises at least one material selected from a group consisting of copper (Cu), a copper-platinum alloy (Cu—Pt), titanium (Ti), platinum (Pt), a titanuum-platinum alloy (Ti—Pt), an anodized copper-zinc alloy (Cu—Zn, i.e., brass), a platinized titanium (Pt/Ti), and a platinized copper-zinc (Pt/Cu—Zn, i.e., platinized brass).

7. A method, as recited in claim 5, wherein said electroplating comprises a plating condition selected from a group consisting of a direct voltage in the range of approximately 1 V to approximately 4 V and a direct current in the range of approximately 0.01 A, to approximately 0.2 A.

8. A method, as recited in claim 5, wherein the Zn-doping in the reduced-oxygen Cu—Zn alloy thin film is controllable by varying at least one electroplating condition selected from a group consisting of:

increasing the at least one zinc (Zn) ion source concentration, thereby slowly increasing said Zn-doping;

increasing the at least one copper (Cu) ion source concentration, thereby slowly decreasing said Zn-doping;

increasing the solution flow rate increases Zn-doping, thereby increasing the pH decreases cathodic efficiency with respect to Zn, and thereby decreasing said Zn-doping;

increasing the electroplating duration, thereby slowly decreasing said Zn-doping;

using a Cu anode, thereby decreasing said Zn-doping:

using a brass anode, thereby increasing said Zn-doping;

increasing the voltage, thereby increasing the Zn-doping; and increasing the current, thereby increasing tie Zn-doping.

9. A method, as recited in claim 1, wherein the annealing step is performed in a temperature range of approximately 150° C. to approximately 450° C., and wherein the annealing step is performed for a duration range of approximately 0.5 minutes to approximately 60 minutes.

10. A semiconductor device, having a reduced-oxygen copper-zinc alloy (Cu—Zn) thin film formed on a copper (Cu) surface by electroplating the Cu surface in a chemical solition, fabricated by a method comprising the steps of:

forming a Cu surface on a semiconductor substrate;

providing a chemical solution;

electroplating the Cu surface in the chemical solution, thereby forming a Cu—Zn alloy thin film on the Cu surface, wherein the Cu—Zn alloy thin film completely covers the Cu surface;

rinsing the Cu—Zn alloy thin film in a solvent;

drying the Cu—Zn alloy thin film under a gaseous flow;

annealing the Cu—Zn alloy thin film formed on the Cu surface, thereby forming a reduced-oxygen Cu—Zn alloy thin film; and completing formation of the semiconductor device.

11. A device, as recited in claim 10, wherein the chemical solution is nontoxic and aqueous, and wherein the chemical solution comprises:

at least one zinc (Zn) ion source for providing a plurality of Zn ions;

at least one copper (Cu) ion source for providing a plurality of Cu ions;

at least one complexing agent for complexing the plurality of Cu ions;

at least one pH adjuster;

at least one wetting agent for stabilizing the chemical solution, all being dissolved in a volume of deionized (DI) water.

12. A device, as recited in claim 11, wherein the at least one zinc (Zn) ion source comprises at least one zinc salt selected from a group consisting of zinc acetate $((CH_3CO_2)_2Zn)$, zinc bromide $(ZnBr_2)$, zinc carbonate hydroxide $(ZnCO_3.2Zn(OH)_2)$, zinc dichloride $(ZnCl_2)$, zinc citrate $((O_2CCH_2C(OH)(CO_2)CH_2CO_2)_2Zn_3)$, zinc iodide $(ZnI_2)$, zinc L-lactate $((CH_3CH(OH)CO_2)_2Zn)$, zinc nitrate $(Zn(NO_3)_2)$, zinc stearate $((CH_3(CH_2)_{16}CO_2)_2Zn)$, zinc sulfate $(ZnSO_4)$, zinc sulfide (ZnS), zinc sulfite $(ZnSO_3)$, and their hydrates.

13. A device, as recited in claim 11, wherein the at least one copper (Cu) ion source comprises at least one copper salt selected from a group consisting of copper(I) acetate $(CH_3CO_2Cu)$, copper(II) acetate $((CH_3CO_2)_2Cu)$, copper(I) bromide (CuBr), copper (II) bromide $(CuBr_2)$, copper (II) hydroxide $(Cu(OH)_2)$, copper (II) hydroxide phosphate $(Cu_2(OH)PO_4)$, copper(I) iodide (CuI), copper (II) nitrate $((CuNO_3)_2)$, copper(II) sulfate $(CuSO_4)$, copper(I) sulfide $(Cu_2S)$, copper(II) sulfide (CuS), copper (II) tartrate $((CH(OH)CO_2)_2Cu)$, and their hydrates.

14. A device, as recited in claim 10,
wherein said electroplating step of said method comprises using an electroplating apparatus, and
wherein said electroplating apparatus comprises:
  (a) a cathod-wafer;
  (b) an anode;
  (c) an electroplating vessel; and
  (d) a voltage source.

15. A device, as recited in claim 14,
wherein the cathode-wafer comprises the Cu surface, and
wherein the anode comprises at least one material selected from a group consisting of copper (Cu), a copper-platinum alloy (Cu—Pt), titanium (Ti), platinum (Pt), a titanium-platinum alloy (Ti—Pt), an anodized copper-zinc alloy (Cu—Zn, i.e., brass), a platinized titanium (Pt/Ti), and a platinized copper-zinc (Pt/Cu—Zn, i.e., platinized brass).

16. A device, as recited in claim 14,
wherein said electroplating comprises a plating condition selected from a group consisting of a direct voltage in the range of approximately 1 V to approximately 4 V and a direct current in the range of approximately 0.01 A to approximately 0.2 A.

17. A device, as recited in claim 14,
wherein the Zn-doping (i.e., Zn content) in the reduced-oxygen Cu—Zn alloy thin film is controllable by varying at least one electroplating condition selected from a group consisting of:
increasing the at least one zinc (Zn) ion source concentration, thereby slowly increasing said Zn-doping;
increasing the at least one copper (Cu) ion source concentration, thereby slowly decreasing said Zn-doping;
increasing the solution flow rate increases Zn-doping, thereby increasing the pH decreases cathodic efficiency with respect to Zn, and thereby decreasing said Zn-doping;
increasing the electroplating duration, thereby slowly decreasing said Zn-doping;
using a Cu anode, thereby decreasing said Zn-doping;
using a brass anode, thereby increasing said Zn-doping;
increasing the voltage, thereby increasing the Zn-doping; and
increasing the current, thereby increasing the Zn-doping.

18. A semiconductor device having a reduced-oxygen copper-zinc alloy (Cu—Zn) thin film formed on a copper (Cu) surface, comprising:
a semiconductor substrate having at least one Cu surface formed thereon; and
a reduced-oxygen Cu—Zn alloy thin film formed, by electroplating, and disposed on the at least one Cu surface, wherein the reduced-oxygen Cu—Zn alloy thin film completely covers the at least one Cu surface,
wherein the reduced oxygen Cu—Zn alloy thin film is formed by annealing a Cu—Zn alloy thin film in a temperature range of approximately 150° C. to approximately 450° C., and
wherein the reduced-oxygen Cu—Zn alloy thin film is formed by annealing a Cu—Zn alloy thin film for a duration range of approximately 0.5 minutes to approximately 60 minutes.

* * * * *